(12) United States Patent
Liu

(10) Patent No.: US 12,349,574 B2
(45) Date of Patent: Jul. 1, 2025

(54) DISPLAY PANEL, MANUFACTURING METHOD THEREOF, AND DISPLAY DEVICE

(71) Applicant: BOE TECHNOLOGY GROUP CO., LTD., Beijing (CN)

(72) Inventor: Yue Liu, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 541 days.

(21) Appl. No.: 17/764,185

(22) PCT Filed: May 12, 2021

(86) PCT No.: PCT/CN2021/093339
§ 371 (c)(1),
(2) Date: Mar. 26, 2022

(87) PCT Pub. No.: WO2021/258886
PCT Pub. Date: Dec. 30, 2021

(65) Prior Publication Data
US 2022/0352299 A1    Nov. 3, 2022

(30) Foreign Application Priority Data

Jun. 22, 2020    (CN) .......................... 202010575778.0

(51) Int. Cl.
*H10K 59/35*    (2023.01)
*H10K 59/173*   (2023.01)
(Continued)

(52) U.S. Cl.
CPC ......... *H10K 59/353* (2023.02); *H10K 59/173* (2023.02); *H10K 59/80521* (2023.02); *H10K 71/00* (2023.02)

(58) Field of Classification Search
None
See application file for complete search history.

(56) References Cited

U.S. PATENT DOCUMENTS 9,818,970 B2    11/2017  Wu
2003/0001488 A1*  1/2003  Sundahl ............. H10K 59/8794
                                                    313/483
(Continued)

FOREIGN PATENT DOCUMENTS

CN    104134681 A    11/2014
CN    109599414 A    4/2019
(Continued)

OTHER PUBLICATIONS

China Patent Office, First Office Action dated Sep. 30, 2022, for corresponding Chinese application 202010575778.0.

*Primary Examiner* — Xiaoming Liu
(74) *Attorney, Agent, or Firm* — HOUTTEMAN LAW LLC

(57) ABSTRACT

Embodiments of the present disclosure provide a display panel, a manufacturing method thereof, and a display device. The display panel includes a substrate, and a plurality of pixel units on the substrate. The pixel units are arranged in an array, and two adjacent columns of pixel units are spaced apart from each other to form an interval area. Each pixel unit includes a pixel defining layer and sub-pixels, and the sub-pixels are in pixel areas defined by the pixel defining layer. Cathodes of all sub-pixels in one column of pixel units are connected as one single piece.

20 Claims, 5 Drawing Sheets

(51) Int. Cl.
   *H10K 59/80*    (2023.01)
   *H10K 71/00*    (2023.01)

(56)           References Cited

U.S. PATENT DOCUMENTS

2017/0294493 A1*  10/2017  Yoo ..................... H10K 59/122
2019/0355795 A1*  11/2019  Liu ..................... G09G 3/3225
2020/0135967 A1*   4/2020  Cho ....................... H01L 33/56
2020/0194676 A1    6/2020  Chang et al.
2021/0134899 A1    5/2021  Peng et al.
2021/0408345 A1*  12/2021  Yao ....................... H01L 33/56
2022/0102670 A1    3/2022  Peng et al.

FOREIGN PATENT DOCUMENTS

CN       110767696 A     2/2020
CN       110785867 A     2/2020
CN       110890477 A     3/2020
CN       111682120 A     9/2020

* cited by examiner

DISPLAY PANEL, MANUFACTURING METHOD THEREOF, AND DISPLAY DEVICE

CROSS REFERENCE TO RELATED APPLICATION

This application is a National Phase Application filed under 35 U.S.C. 371 as a national stage of PCT/CN2021/093339, filed on May 12, 2021, an application claiming the priority of the Chinese patent application No. 202010575778.0, filed on Jun. 22, 2020, the contents of which are incorporated herein by reference in their entirety.

TECHNICAL FIELD

Embodiments of the present disclosure belong to the field of display technology, and in particular relate to a display panel, a manufacturing method thereof, and a display device.

BACKGROUND

Organic light-emitting diode (OLED) devices have been widely used in panel display such as mobile phones, automotive displays and cameras due to its unique excellent characteristics such as self-illumination, wide color gamut, fast response, thin panel, flexibility and low temperature resistance. OLED display tends to replace traditional liquid crystal display and is recognized as the next generation of screen display technology.

OLED display may be divided into Active Matrix OLED (AMOLED) and Passive Matrix OLED (PMOLED) according to driving manner. For PMOLED, cathodes and anodes form a matrix, pixels in the matrix are lit up by scanning, each pixel operates in a short-pulse mode and emits light with instantaneous high brightness. The advantage is that the structure is simple, and the manufacturing cost can be effectively reduced.

SUMMARY

Embodiments of the present disclosure provide a display panel, a manufacturing method thereof, and a display device.

In a first aspect, embodiments of the present disclosure provides a display panel, including: a substrate, and a plurality of pixel units on the substrate. The plurality of pixel units are arranged in an array, and two adjacent columns of the pixel units are spaced apart from each other to form an interval area. Each pixel unit includes a pixel defining layer and sub-pixels, and the sub-pixels are in pixel areas defined by the pixel defining layer. Cathodes of all sub-pixels in one column of pixel units are connected as one single piece.

A transparent inhibition layer is further in the interval area, the pixel defining layer and the transparent inhibition layer are arranged in sequence in a direction away from the substrate, and an orthographic projection of the transparent inhibition layer on the substrate completely covers the interval area.

In some embodiments, the transparent inhibitor layer adopts a transparent inorganic inhibitor or a transparent organic inhibitor, and the cathodes adopt magnesium or modified magnesium.

In some embodiments, the transparent inhibition layer adopts any one of 8-hydroxyquinoline-lithium, 8-hydroxyquinoline aluminum salt, and lithium fluoride.

In some embodiments, the sub-pixels in each pixel unit include a first sub-pixel, a second sub-pixel and a third sub-pixel.

The first sub-pixel and the second sub-pixel are arranged on a straight line, and the third sub-pixel is not on the straight line on which the first sub-pixel and the second sub-pixel are arranged.

In some embodiments, a shape of each sub-pixels is a regular hexagon.

The first sub-pixel and the second sub-pixel are arranged along a row direction of the array, and along the row direction of the array, third sub-pixels in any two adjacent pixel units are respectively located on different sides of straight lines on which the first sub-pixels and the second sub-pixels in the pixel units including the third sub-pixels are arranged.

Along a column direction of the array, the third sub-pixel in each pixel unit is located on a same side of the straight line on which the first sub-pixel and the second sub-pixel in the pixel unit including the third sub-pixel are arranged.

In some embodiments, the shape of each sub-pixel is a rectangle;

The first sub-pixel and the second sub-pixel are arranged along the column direction of the array, and along the column direction of the array, the third sub-pixel in each pixel unit is located on a same side of the straight line on which the first sub-pixel and the second sub-pixel in the pixel unit including the third sub-pixel are arranged.

In some embodiments, in each pixel unit, the first sub-pixel, the second sub-pixel and the third sub-pixel are spaced apart from each other, and the third sub-pixel corresponds to an interval between the first sub-pixel and the second sub-pixel.

In some embodiments, an orthographic projection of the cathodes in one column of pixel units on the substrate covers all sub-pixels in the one column of pixel units and intervals between all the sub-pixels in the one column of pixel units.

In some embodiments, colors of the first sub-pixel, the second sub-pixel and the third sub-pixel are different.

The color of the first sub-pixel is any one of red, green, and blue.

The color of the second sub-pixel is any one of red, green and blue.

The color of the third sub-pixel is any one of red, green and blue.

In a second aspect, the embodiments of the present disclosure further provide a display device including the display panel as described above.

In a third aspect, the embodiments of the present disclosure further provide a manufacturing method of a display panel, including:

forming a plurality of pixel units on a substrate; the plurality of pixel units being arranged in an array, and two adjacent columns of the pixel units being spaced apart from each other to form an interval area; and forming the plurality of pixel units includes forming a pixel defining layer and sub-pixels, the sub-pixels being formed in pixel areas defined by the pixel defining layer; and cathodes of all sub-pixels in one column of pixel units being formed as one single piece;

after forming the pixel defining layer and before forming cathodes, the manufacturing method of the display panel further includes forming a transparent inhibition layer, the transparent inhibition layer is formed in the interval area, and an orthographic projection of the transparent inhibition layer on the substrate completely covers the interval area.

In some embodiments, forming the transparent inhibition layer includes: forming a pattern of a part of the transparent inhibition layer by evaporation using a mask plate having a partial transparent inhibition layer pattern; and moving the mask plate having the partial transparent inhibition layer pattern, and forming a pattern of the other part of the transparent inhibition layer by evaporation.

In some embodiments, forming the transparent inhibition layer includes: splicing a first mask plate having a partial transparent inhibition layer pattern and a second mask plate having another partial transparent inhibition layer pattern together such that the partial transparent inhibition layer pattern and the another partial transparent inhibition layer pattern are spliced together to form a pattern of a complete transparent inhibition layer; and forming the pattern of the transparent inhibition layer by evaporation.

In some embodiments, patterns of the transparent inhibition layer on the first mask plate and the second mask plate are the same, and the partial transparent inhibition layer pattern on the first mask plate and the another partial transparent inhibition layer pattern on the second mask plate are partially overlapped.

In some embodiments, forming cathodes includes: forming a pattern of the cathodes by evaporation using a mask plate having a first pattern;

wherein the first pattern is an overall pattern of areas where all pixel units are located and all interval areas on the substrate.

BRIEF DESCRIPTION OF DRAWINGS

Accompanying drawings, which are used to provide further understanding of embodiments of the present disclosure and constitute a part of the specification, are used to explain the present disclosure together with the embodiments of the present disclosure, and do not limit the present disclosure. The above and other features and advantages will become more apparent to those skilled in the art through description of detailed example embodiments with reference to the accompanying drawings, in which.

Figure 1:
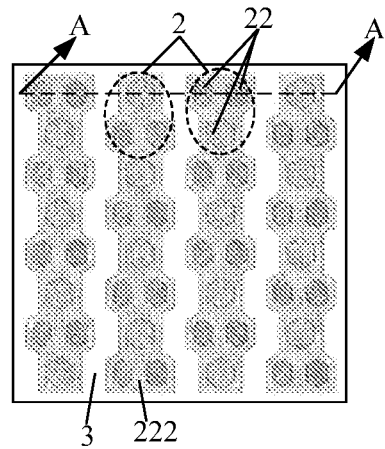
FIG. 1 is a top view of a structure of a display panel according to an embodiment of the present disclosure.

REFERENCE NUMERALS 1, substrate; 2, pixel unit; 21, pixel defining layer; 22, sub-pixel; 220, anode; 221, light-emitting functional layer; 222, cathode; 3, transparent inhibition layer; 201, first sub-pixel; 202, second sub-pixel; 203, third sub-pixel; 4, partial transparent inhibition layer pattern; 5, mask plate; 6, partial transparent inhibition layer pattern; 7, first mask plate; 8, another partial transparent inhibition layer pattern; 9, second mask plate.

DETAIL DESCRIPTION OF EMBODIMENTS

In order for those skilled in the art to better understand technical solutions of embodiments of the present disclosure, a display panel, a manufacturing method thereof, and a display device provided by the embodiments of the present disclosure are further described in detail below with reference to the accompanying drawings and specific embodiments.

Hereinafter, the embodiments of the present disclosure will be described more fully with reference to the accompanying drawings, but the embodiments to be described may be embodied in different forms and should not be construed as limited to the embodiments set forth in the present disclosure. Rather, the embodiments are provided such that the present disclosure will be thorough and complete, and will fully convey the scope of the present disclosure to those skilled in the art.

Embodiments of the present disclosure are not limited to the embodiments shown in the accompanying drawings, but include modifications of configurations formed based on manufacturing processes. Accordingly, regions illustrated in the accompanying drawings are of schematic nature, shapes of the regions shown in the accompanying drawings only illustrate examples of specific shapes of the regions and are not intended to be limiting.

With the coming of the era of "full screen", design of an under-screen identification device (e.g., under-screen camera) has become a mainstream solution. In order to improve identification effect of the under-screen identification device, certain requirements are put forward to transmittance of the screen. Light transmission for under-screen identification is mainly realized through interval areas between cathodes.

For PMOLED (Passive Matrix OLED), the cathodes of PMOLED are usually separated by separation spacers, that is, the cathodes are separated into independent areas by the separation spacers, and the light transmission for under-screen identification is mainly realized through areas of the separation spacers. However, a process for manufacturing the separation spacers is complicated and light transmittance is low; and sometimes the separation spacers cannot completely separate the cathodes into independent areas, which affects display quality.

Aiming at the problem of low light transmittance for under-screen identification caused by the above-mentioned method of separating the cathodes of PMOLED by using the separation spacers, exemplary embodiments of the present disclosure provide a display panel, a manufacturing method thereof, and a display device.

Figure 2:
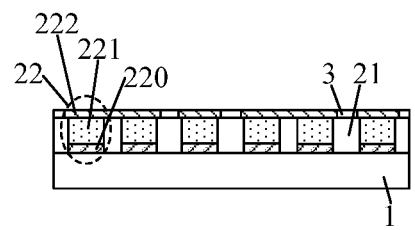
FIG. 2 is a cross-sectional view of a structure of the display panel in FIG. 1 along a section line AA.

An embodiment of the present disclosure provides a display panel, which, as shown in FIG. 1 and FIG. 2, includes: a substrate 1, and a plurality of pixel units 2 disposed on the substrate 1. The plurality of pixel units 2 are arranged in an array, and two adjacent columns of pixel units 2 are spaced apart from each other to form an interval area. The pixel unit 2 includes a pixel defining layer 21 and sub-pixels 22, the sub-pixels 22 are disposed in pixel areas defined by the pixel defining layer 21, and the sub-pixel 22 includes an anode 220, a light-emitting functional layer 221 and a cathode 222 that are sequentially stacked on the substrate 1. Cathodes 222 of sub-pixels 22 in one column of pixel units 2 are connected as one single piece. A transparent inhibition layer 3 is further disposed in the interval area, the pixel defining layer 21 and the transparent inhibition layer 3 are sequentially arranged in a direction away from the substrate 1, and an orthographic projection of the transparent inhibition layer 3 on the substrate 1 completely covers the interval area.

Optionally, in the embodiment, the transparent inhibition layer 3 adopts a transparent inorganic inhibitor or a transparent organic inhibitor, and the cathode 222 adopts magnesium or modified magnesium.

The display panel is a Passive Matrix OLED (PMOLED) display panel. Magnesium and inorganic/organic inhibitor are mutually exclusive. Modified magnesium refers to the magnesium that is modified to be more exclusive with the inorganic inhibitor or the organic inhibitor. In the display panel, the transparent inhibition layer 3 adopts a transparent inorganic inhibitor material or a transparent organic inhibitor material, and the cathode adopts magnesium or modified magnesium. Since the material of the transparent inhibition layer 3 and the material of the cathode 222 are mutually exclusive, the material of the transparent inhibition layer 3 can prevent the material of the cathode 222 from forming a film. By providing the material of the transparent inhibition layer 3 in the interval area, it can be ensured that the material of the cathode 222 will not form a film in the interval area, and at the same time, it can also be ensured that the material of the cathode 222 can completely cover actual pixel light-emitting areas, so as to ensure that the cathodes 222 of adjacent columns of pixel units 2 are independent of each other, thereby ensuring that the display panel can display normally. Because the material of the transparent inhibition layer 3 has good light transmittance, light transmittance of the display panel can be greatly improved, so that light transmittance for the under-screen identification device of the display panel can be greatly improved, thereby meeting the requirements of the under-screen identification device for the light transmittance of the display panel. In addition, compared with the current technique of adopting the separation spacers, a process for manufacturing the transparent inhibition layer 3 is simple, and difficulty in implementing the process is low.

In the embodiment, the material of the transparent inhibition layer 3 is any one of 8-hydroxyquinoline-lithium (Liq), 8-Hydroxyquinoline aluminum salt (Alq3), and lithium fluoride (LiF).

Figure 3:
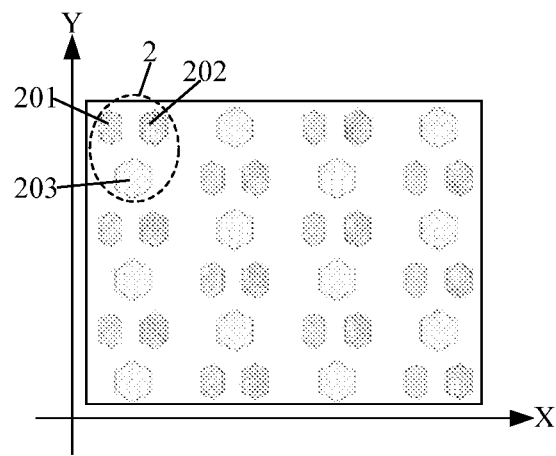
FIG. 3 is a top view of an arrangement of sub-pixels in the display panel in FIG. 1.

In some embodiments, as shown in FIG. 3, the sub-pixels 22 includes a first sub-pixel 201, a second sub-pixel 202 and a third sub-pixel 203. The first sub-pixel 201 and the second sub-pixel 202 are arranged on a straight line, and the third sub-pixel 203 is not on the same straight line as the first sub-pixel 201 and the second sub-pixel 202.

Further in some embodiments, the sub-pixels 22 are in the shape of a regular hexagon. The first sub-pixel 201 and the second sub-pixel 202 are arranged along a row direction X of the array, and along the row direction X of the array, the third sub-pixels 203 in any two adjacent pixel units 2 are respectively located on different sides of the straight lines on which the first sub-pixels 201 and the second sub-pixels 202 in the pixel units 2 including the third sub-pixels are arranged. Along a column direction Y of the array, the third sub-pixel 203 in each pixel unit 2 is located on a same side of the straight line on which the first sub-pixel 201 and the second sub-pixel 202 in the pixel unit 2 including the third sub-pixel 203 are arranged. The shape and arrangement of the sub-pixels 22 can effectively increase the area of the interval area under the condition that the area of the display area of the display panel is fixed, so that transmittance of light for the under-screen identification device can be improved, and the requirements of the under-screen identification device for the light transmittance of the display panel can be better met.

In some embodiments, in the pixel unit 2, the first sub-pixel 201, the second sub-pixel 202 and the third sub-pixel 203 are spaced apart from each other, and the third sub-pixel 203 corresponds to an interval between the first sub-pixel 201 and the second sub-pixel 202. Interval. In this way, under the condition that the display area of the display panel is fixed, the area of the interval area can be further increased effectively, so that the transmittance of light for the under-screen identification device can be improved, and the requirements of the under-screen identification device for the light transmittance of the display panel can be better met.

In some embodiments, orthographic projections of the cathodes 222 in one column of pixel units 2 on the substrate 1 covers all sub-pixels 22 in one column of pixel units 2 and intervals between those sub-pixels 22. In addition, in one row of pixel units 2, the anodes of the sub-pixels 22 of the same color in respective pixel units 2 are each connected to one data line. When the display panel is driven for display, all pixel unit 2 in one row of pixel units 2 are scanned one by one, and the cathodes 222 are supplied with signals one by one, so as to drive the PMOLED display panel to display.

In some embodiments, colors of the first sub-pixel 201, the second sub-pixel 202 and the third sub-pixel 203 are different. The color of the first sub-pixel 201 is any one of red, green and blue; the color of the second sub-pixel 202 is any one of red, green, and blue; and the color of the third sub-pixel 203 is any one of red, green, and blue.

It should be noted that sizes of the first sub-pixel 201 and the second sub-pixel 202 are the same, and a size of the third sub-pixel 203 may be the same as or different from the size of the first sub-pixel 201 and the second sub-pixel 202, which depends on the display effect to be realized as actually required.

In addition, it should be noted that the sub-pixels may also be in the shape of a circle or other regular polygon, as long as the area of the interval area can be relatively increased while realizing normal display of the display panel, and the shape of the sub-pixels may be arbitrary, which is within the protection scope of the embodiments of the present disclosure.

Based on the above structure of the display panel, an embodiment also provides a manufacturing method of the display panel, including: forming a plurality of pixel units on a substrate. The plurality of pixel units are arranged in an array, and two adjacent columns of pixel units are spaced apart from each other to form an interval area. Forming the pixel unit includes forming a pixel defining layer and sub-pixels, and the sub-pixels are formed in pixel areas defined by the pixel defining layer. Forming the sub-pixel includes sequentially forming an anode, a light-emitting functional layer and a cathode on the substrate. Cathodes of sub-pixels in one column of pixel units are formed as one single piece. The manufacturing method of the display panel further includes forming a transparent inhibition layer after forming the pixel defining layer and before forming the cathodes, the transparent inhibition layer is formed in the interval area, and an orthographic projection of the transparent inhibition layer on the substrate completely covers the interval area.

In the embodiment, before forming the transparent inhibition layer, the manufacturing method of the display panel includes: sequentially forming the anode, the pixel defining layer, and the light-emitting functional layer on the substrate. The anode, the pixel defining layer, and the light-emitting functional layer are all formed by existing processes, which are not described repeatedly herein.

In the manufacturing method of the display panel, since the material of the transparent inhibition layer and the material of the cathode are mutually exclusive, the material of the transparent inhibition layer can prevent the material of the cathode from forming a film. By forming the material of the transparent inhibition layer in the interval area, it can be ensured that the material of the cathode will not form a film in the interval area, and at the same time, it can also be ensured that the material of the cathode can completely cover actual pixel light-emitting areas, so as to ensure that the cathodes of adjacent columns of pixel units are independent of each other, thereby ensuring normal display of the display panel. Compare with the current technique of forming the separation spacers to form independent cathodes, a process for manufacturing the transparent inhibition layer is simple, and difficulty in implementing the process is low.

Figure 4:
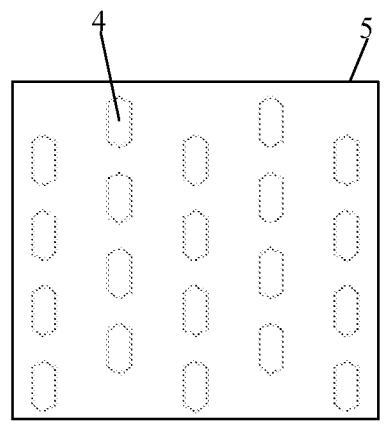
FIG. 4 is a top view of a structure of a mask plate having a partial transparent inhibition layer pattern according to an embodiment of the present disclosure.
Figure 5:
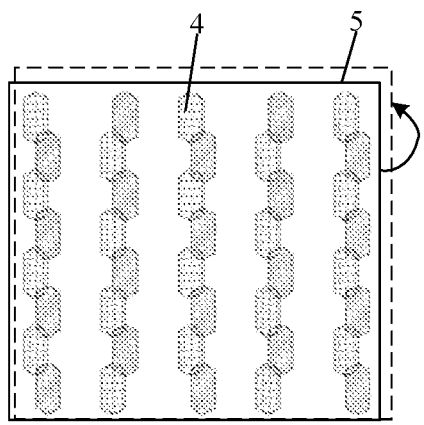
FIG. 5 is a schematic diagram of a process of forming a pattern of a transparent inhibition layer by evaporation using the mask plate in FIG. 4.
Figure 6:
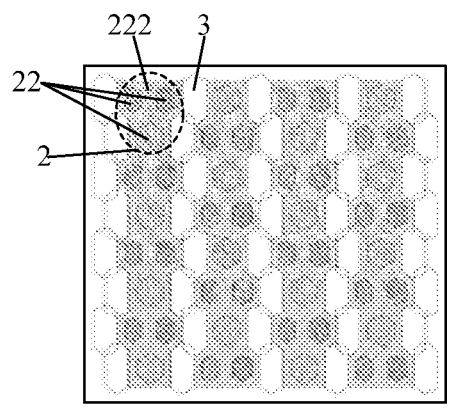
FIG. 6 is a schematic diagram illustrating evaporation effect of patterns of transparent inhibition layers and cathodes of a display panel according to an embodiment of the present disclosure.

In some embodiments, as shown in FIGS. 4 to 6, forming the transparent inhibition layer includes the following steps S101 and S102.

In step S101, a mask plate 5 with a partial transparent inhibition layer pattern 4 is adopted to form a pattern of one part of the transparent inhibition layer by evaporation.

In step S102, the mask plate 5 with the partial transparent inhibition layer pattern 4 is moved and adopted to form a pattern of the other part of the transparent inhibition layer by evaporation.

In some embodiments, forming the cathodes 222 includes: forming a pattern of the cathodes 222 by evaporation using a mask plate having a first pattern. The first pattern is an overall pattern of areas where the pixel units are located and the interval areas on the substrate. That is, the first pattern corresponds to the display area of the entire display panel. In the process of forming the pattern of the cathodes 222 by evaporation, since the pattern of the transparent inhibition layer 3 has been formed in each interval area, due to the mutual exclusive property between the material of the transparent inhibition layer and the material of the cathodes, the material of the cathodes cannot form a film in the area of the pattern of the transparent inhibition layer 3, thereby forming patterns of the cathodes 222 which are independent of each other.

Figure 7:
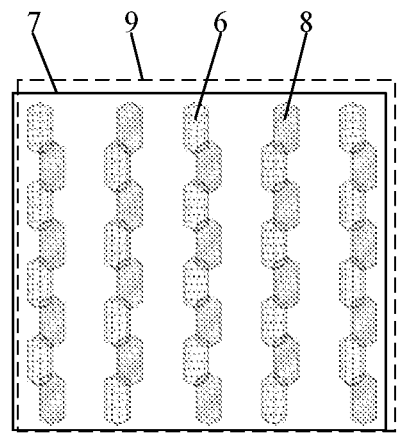
FIG. 7 is a schematic diagram of a process of forming a pattern of a transparent inhibition layer by evaporation using a first mask plate and a second mask plate according to an embodiment of the present disclosure.

It should be noted that, in the manufacturing method of the display panel in the embodiment, the step of forming the transparent inhibition layer may also include steps S101' and S102' as shown in FIG. 7.

In step S101', a first mask 7 with a partial transparent inhibition layer pattern 6 and a second mask 9 with another partial transparent inhibition layer pattern 8 are spliced together such that the partial transparent inhibition layer pattern 6 and another part partial transparent inhibition layer pattern 8 are spliced together to form a pattern of the complete transparent inhibition layer.

In step S102', the pattern of the transparent inhibition layer is formed by evaporation.

In some embodiments, the partial transparent inhibition layer pattern on the first mask plate 7 and the another partial transparent inhibition layer pattern on the second mask plate 9 are the same, and the partial transparent inhibition layer pattern 6 on the first mask 7 and another partial transparent inhibition layer pattern 8 on the second mask 9 are partially overlapped. In this way, the pattern of the complete transparent inhibition layer can be formed by seamless splicing, so that the pattern of the transparent inhibition layer can be formed by one evaporation.

In the manufacturing method of the display panel, the process for forming the transparent inhibiting layer is simple, and the difficulty in implementing the process is low.

Figure 8:
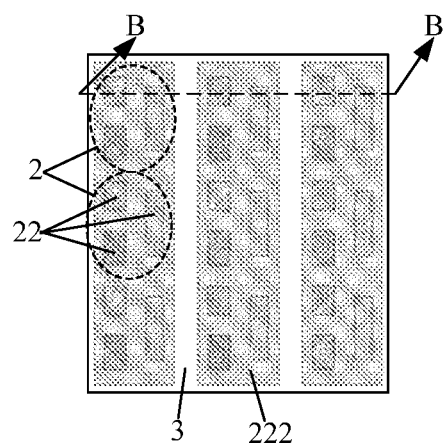
FIG. 8 is a top view of a structure of another display panel according to an embodiment of the present disclosure.
Figure 9:
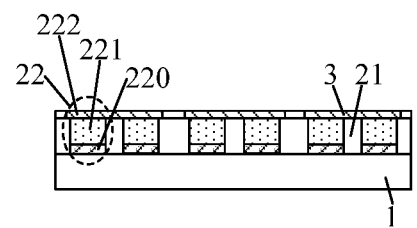
FIG. 9 is a cross-sectional view of a structure of the display panel in FIG. 8 along a section line BB.
Figure 10:
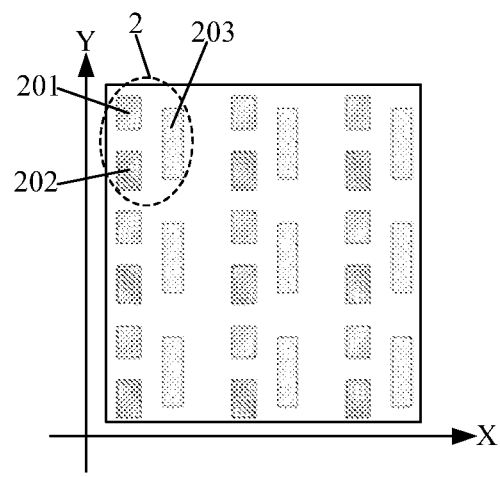
FIG. 10 is a top view of an arrangement of sub-pixels in the display panel in FIG. 8.
Figure 11:
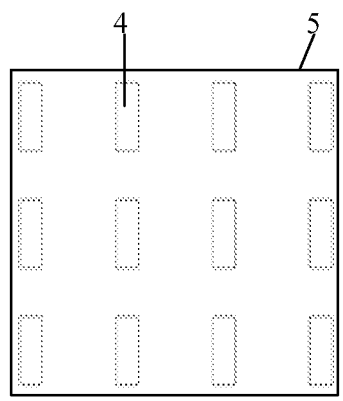
FIG. 11 is a top view of a structure of a mask plate having a partial transparent inhibition layer pattern according to another embodiment of the present disclosure.
Figure 12:
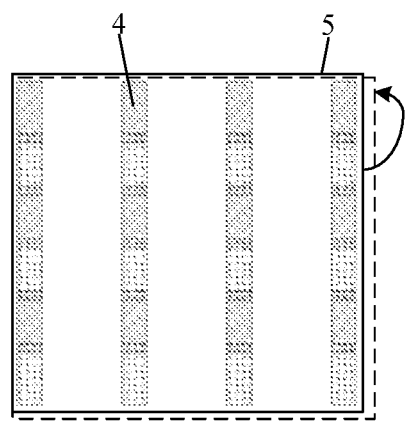
FIG. 12 is a schematic diagram of a process of forming a pattern of a transparent inhibition layer by evaporation using the mask plate in FIG. 11.
Figure 13:
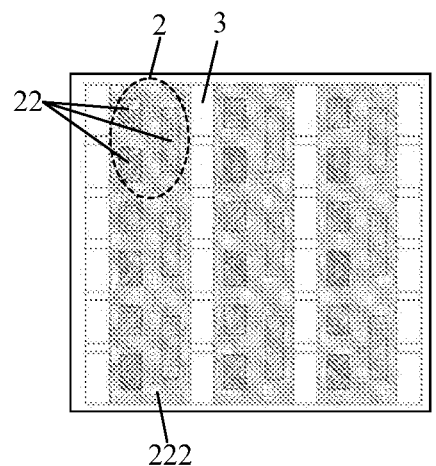
FIG. 13 is a schematic diagram illustrating evaporation effect of patterns of transparent inhibition layers and cathodes of another display panel according to an embodiment of the present disclosure.
Figure 14:
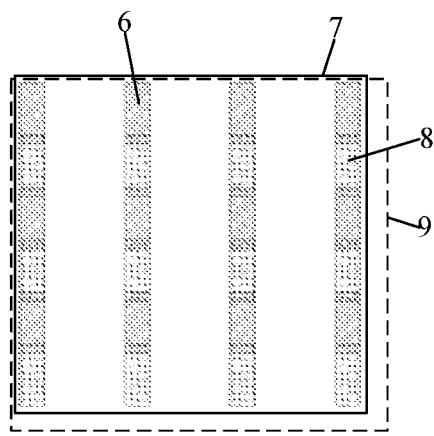
FIG. 14 is a schematic diagram of a process of forming a pattern of a transparent inhibition layer by evaporation using a first mask plate and a second mask plate according to another embodiment of the present disclosure.

Embodiments of the present disclosure also provide a display panel. As shown in FIGS. 8 to 10, it is different from the above-described embodiments that the sub-pixels 22 are in the shape of a rectangle; the first sub-pixels 201 and the second sub-pixels 202 are arranged along the column direction Y of the array, and the third sub-pixel 203 in each pixel unit 2 is located, along the column direction Y of the array, on a same side of the straight line on which the first sub-pixel 201 and the second sub-pixel 202 in the pixel unit 2 including the third sub-pixel 203 are arranged.

The shape and arrangement of the sub-pixels can effectively increase the area of the interval area under the condition that the area of the display area of the display panel is fixed, so that transmittance of light for the under-screen identification device can be improved, and the requirements of the under-screen identification device for the light transmittance of the display panel can be better met.

Other structures of the display panel in this embodiment are the same as those in the above-described embodiments, and will not be repeated here.

Based on the above structure of the display panel, the embodiments also provide a manufacturing method of the display panel. As shown in FIGS. 11 to 14, the manufacturing method of the display panel in this embodiment is the same as that in the above-described embodiments, and is not repeated here.

In the display panel provided in the above embodiment, the transparent inhibition layer adopts a transparent inorganic inhibitor material or a transparent organic inhibitor material, and the cathode adopts magnesium or modified magnesium. Since the material of the transparent inhibition layer and the material of the cathode are mutually exclusive, the material of the transparent inhibition layer can prevent the material of the cathode from forming a film. By forming the material of the transparent inhibition layer in the interval area, it can be ensured that the material of the cathode will not form a film in the interval area, and at the same time, it can also be ensured that the material of the cathode can completely cover actual pixel light-emitting areas, so as to ensure that the cathodes of pixel units in adjacent columns are independent of each other, thereby ensuring that the display panel can display normally. Because the material of the transparent inhibition layer has good light transmittance, light transmittance of the display panel can be greatly improved, so that light transmittance for the under-screen identification device of the display panel can be greatly improved, thereby meeting the requirements of the under-screen identification device for the light transmittance of the display panel. In addition, compared with the current technique of adopting the separation spacers, the process for manufacturing the transparent inhibition layer is simple, and difficulty in implementing the process is low.

An embodiment of the present disclosure further provides a display device, including the display panel in any one of the above-described embodiments.

By using the display panel in any one of the above-described embodiments, the light transmittance of the display device can be improved while ensuring normal display of the display device, so that the requirements of the under-screen identification device for the light transmittance of the display device can be met. In addition, the display device has a simple manufacturing process and low process difficulty.

The display device provided by exemplary embodiments of the present disclosure may be any product or component with a display function, such as an OLED panel, an OLED TV, a display, a mobile phone, or a navigator.

It should be understood that the above embodiments are merely exemplary embodiments that are employed to illustrate the principles of the present disclosure, and the present disclosure is not limited thereto. Various changes and modifications may be made by those skilled in the art without departing from the spirit and essence of the present disclosure, and should be considered to fall within the protection scope of the present disclosure.

What is claimed is:

1. A display panel, comprising: a substrate, and a plurality of pixel units on the substrate; wherein the plurality of pixel units are arranged in an array, and two adjacent columns of the pixel units are spaced apart from each other to form an interval area; each pixel unit comprises a pixel defining layer and sub-pixels, and the sub-pixels are in pixel areas defined by the pixel defining layer; cathodes of all sub-pixels in one column of pixel units are connected as one single piece;
   wherein the interval area is further provided therein with a transparent inhibition layer, the pixel defining layer and the transparent inhibition layer are arranged in sequence in a direction away from the substrate, and an orthographic projection of the transparent inhibition layer on the substrate completely covers the interval area; and
   the transparent inhibition layer is located in the interval area and in the same layer with the cathodes of the sub-pixels, and the transparent inhibition layer in the interval area between every two adjacent columns of the pixel units separates cathodes of the two adjacent columns of the pixel units from each other.

2. The display panel of claim 1, wherein the transparent inhibitor layer adopts a transparent inorganic inhibitor or a transparent organic inhibitor, and the cathodes adopt magnesium or modified magnesium.

3. The display panel of claim 2, wherein the transparent inhibition layer adopts any one of 8-hydroxyquinoline-lithium, 8-hydroxyquinoline aluminum salt, and lithium fluoride.

4. The display panel of claim 1, wherein the sub-pixels in each pixel unit comprise a first sub-pixel, a second sub-pixel and a third sub-pixel, and
   the first sub-pixel and the second sub-pixel are arranged on a straight line, and the third sub-pixel is not on the straight line on which the first sub-pixel and the second sub-pixel are arranged.

5. The display panel of claim 4, wherein a shape of each sub-pixels is a regular hexagon;
   the first sub-pixel and the second sub-pixel in each pixel unit are arranged along a row direction of the array, and along the row direction of the array, third sub-pixels in any two adjacent pixel units are respectively located on different sides of straight lines on which the first sub-pixels and the second sub-pixels in the pixel units comprising the third sub-pixels are arranged; and
   along a column direction of the array, the third sub-pixel in each pixel unit is located on a same side of the straight line on which the first sub-pixel and the second sub-pixel in the pixel unit comprising the third sub-pixel are arranged.

6. The display panel of claim 4, wherein the shape of each sub-pixel is a rectangle;
   the first sub-pixel and the second sub-pixel in each pixel unit are arranged along a column direction of the array, and along the column direction of the array, the third sub-pixel in each pixel unit is located on a same side of the straight line on which the first sub-pixel and the second sub-pixel in the pixel unit comprising the third sub-pixel are arranged.

7. The display panel of claim 5, wherein in each pixel unit, the first sub-pixel, the second sub-pixel and the third sub-pixel are spaced apart from each other, and the third sub-pixel corresponds to an interval between the first sub-pixel and the second sub-pixel.

8. The display panel of claim 7, wherein an orthographic projection of the cathodes in one column of pixel units on the substrate covers all sub-pixels in the one column of pixel units and intervals between all the sub-pixels in the one column of pixel units.

9. The display panel of claim 4, wherein colors of the first sub-pixel, the second sub-pixel and the third sub-pixel are different;
   the color of the first sub-pixel is any one of red, green, and blue;
   the color of the second sub-pixel is any one of red, green and blue; and
   the color of the third sub-pixel is any one of red, green and blue.

10. A display device, comprising the display panel of claim 1.

11. The display panel of claim 6, wherein in each pixel unit, the first sub-pixel, the second sub-pixel and the third sub-pixel are spaced apart from each other, and the third sub-pixel corresponds to an interval between the first sub-pixel and the second sub-pixel.

12. A display device, comprising the display panel of claim 2.

13. A display device, comprising the display panel of claim 3.

14. A display device, comprising the display panel of claim 5.

15. A display device, comprising the display panel of claim 4.

16. A manufacturing method of a display panel, comprising:
forming a plurality of pixel units on a substrate; the plurality of pixel units being arranged in an array, and two adjacent columns of the pixel units being spaced apart from each other to form an interval area;
wherein the forming the plurality of pixel units comprises forming a pixel defining layer and sub-pixels, the sub-pixels being formed in pixel areas defined by the pixel defining layer, and cathodes of all sub-pixels in one column of pixel units being formed as one single piece; and
wherein after forming the pixel defining layer and before forming cathodes, the manufacturing method further comprises forming a transparent inhibition layer, the transparent inhibition layer is formed in the interval area, and an orthographic projection of the transparent inhibition layer on the substrate completely covers the interval area; and
the transparent inhibition layer is located in the interval area and in the same layer with the cathodes of the sub-pixels, and the transparent inhibition layer in the interval area between every two adjacent columns of the pixel units separates cathodes of the two adjacent columns of the pixel units from each other.

17. The manufacturing method of claim 16, wherein forming the transparent inhibition layer comprises:
forming a pattern of a part of the transparent inhibition layer by evaporation using a mask plate having a partial transparent inhibition layer pattern, and moving the mask plate having the partial transparent inhibition layer pattern, and forming a pattern of the other part of the transparent inhibition layer by evaporation.

18. The manufacturing method of claim 16, wherein forming the transparent inhibition layer comprises:
splicing a first mask plate having a partial transparent inhibition layer pattern and a second mask plate having another partial transparent inhibition layer pattern together such that the partial transparent inhibition layer pattern and the another partial transparent inhibition layer pattern are spliced together to form a pattern of a complete transparent inhibition layer, and
forming the pattern of the transparent inhibition layer by evaporation.

19. The manufacturing method of claim 18, wherein patterns of the transparent inhibition layer on the first mask plate and the second mask plate are the same, and the partial transparent inhibition layer pattern on the first mask plate and the another partial transparent inhibition layer pattern on the second mask plate are partially overlapped.

20. The manufacturing method of claim 16, wherein forming the cathodes comprises: forming a pattern of the cathodes by evaporation using a mask plate having a first pattern;
wherein the first pattern is an overall pattern of areas where all pixel units are located and all interval areas on the substrate.

* * * * *